US012727383B2

(12) United States Patent
Sakuraba et al.

(10) Patent No.: US 12,727,383 B2
(45) Date of Patent: Sep. 1, 2026

(54) THERMOELECTRIC POWER GENERATION DEVICE

(71) Applicant: NATIONAL INSTITUTE FOR MATERIALS SCIENCE, Tsukuba (JP)

(72) Inventors: Yuya Sakuraba, Tsukuba (JP); Bunpei Masaoka, Tsukuba (JP); Kenichi Uchida, Tsukuba (JP); Weinan Zhou, Tsukuba (JP)

(73) Assignee: National Institute for Materials Science, Tsukuba (JP)

(*) Notice: Subject to any disclaimer, the term of this patent is extended or adjusted under 35 U.S.C. 154(b) by 253 days.

(21) Appl. No.: 18/569,576

(22) PCT Filed: Jun. 10, 2022

(86) PCT No.: PCT/JP2022/023476
§ 371 (c)(1),
(2) Date: Dec. 12, 2023

(87) PCT Pub. No.: WO2022/264940
PCT Pub. Date: Dec. 22, 2022

(65) Prior Publication Data
US 2024/0276881 A1 Aug. 15, 2024

(30) Foreign Application Priority Data
Jun. 14, 2021 (JP) ................................ 2021-098950

(51) Int. Cl.
*H10N 15/20* (2023.01)

(52) U.S. Cl.
CPC .................................. *H10N 15/20* (2023.02)

(58) Field of Classification Search
CPC ....... H10N 15/20; H10N 15/00; H01F 41/308
(Continued)

(56) References Cited

U.S. PATENT DOCUMENTS 3,554,815 A 1/1971 Osborn
2016/0155919 A1 6/2016 Kinoshita et al.
(Continued)

OTHER PUBLICATIONS

JP2014072256A English translation (Year: 2025).*
(Continued)

*Primary Examiner* — Christopher M Koehler
*Assistant Examiner* — Viswanathan Subramanian
(74) *Attorney, Agent, or Firm* — SALIWANCHIK, LLOYD & EISENSCHENK

(57) ABSTRACT

[Object] To provide a thermoelectric power generation device that efficiently utilizes thermal energy/heat flow passing through a power generation module/heat flow sensor.

[Solving Means] It includes a plurality of magnetic wires 21 that is formed of a single magnetic material with large thermoelectric power due to an anomalous Nernst effect and is arranged in parallel on one surface of an insulation film 22; a plurality of non-magnetic wires 23 or a plurality of diamagnetic wires 27 arranged in parallel on the other surface of the insulation film 22 so as to be parallel or oblique to a direction in which the plurality of magnetic wires 21 is extended; through contact holes 24 that pass through the insulation film 22 and electrically connect the plurality of magnetic wires 21 and the plurality of non-magnetic wires 23 or the plurality of diamagnetic wires 27 so that a first magnetic wire 21*a* and a second magnetic wire 21*b* adjacent to each other, of the plurality of magnetic wires, can be connected in series via the plurality of non-magnetic wires 23 or the plurality of diamagnetic wires 27; and a substrate 20 that is formed of an insulating material or a conductive material coated with an insulating material, holds a stacked body of the plurality of magnetic wires 21, the insulation film 22, and the plurality of non-magnetic
(Continued)

wires 23 or the plurality of diamagnetic wires 27, and is in thermal contact with the stacked body.

12 Claims, 6 Drawing Sheets

(58) Field of Classification Search
USPC .......................................................... 310/306
See application file for complete search history.

(56) References Cited

U.S. PATENT DOCUMENTS

2020/0212282 A1 7/2020 Nakatsuji et al.
2021/0036666 A1 2/2021 Krivokapic
2021/0366666 A1 11/2021 Kirihara et al.
2022/0246820 A1 8/2022 Nakatsuji et al.

OTHER PUBLICATIONS

Office Action dated Feb. 4, 2025 in Japanese Application No. 2023-529844.
Supplementary European Search Report dated May 9, 2025 in European Application No. 22824930.6.
Office Action dated May 27, 2025 in Japanese Application No. 2023-529844.
Sakuraba, Y., et al., "Novel thermoelectric applications using anomalous Nernst effect," 64th Compound New Magnetic Material Special Research Group, 2018, pp. 1-3. Abstract Only.
International Search Report dated Aug. 23, 2022 in International Application No. PCT/JP2022/023476.
Machine translation of Japanese Publication No. 2008-130718, published Jun. 5, 2008.
Machine translation of Japanese Publication No. 2014-072256, published Apr. 21, 2014.
Machine translation of Japanese Publication No. 6079995, published Feb. 15, 2017.
Zhou, W. et al., "Heat flux sensing by anomalous Nernst effect in Fe—Al thin films on a flexible substrate," Applied Physics Express, 2020, 13:043001-1-043001-5, The Japan Society of Applied Physics.
Sakai, A. et al., "Giant anomalous Nernst effect and quantum-critical scaling in a ferromagnetic semimetal," Nature Physics, Nov. 2018, 14:1119-1125.
Nakayama, H. et al., "Mechanism of strong enhancement of anomalous Nernst effect in Fe by Ga substitution," Physical Review Materials, 2019, 3:114412-1-114412-8, American Physical Society.
Miura, A. et al., "Observation of anomalous Ettingshausen effect and large transverse thermoelectric conductivity in permanent magnets," Applied Physics Letters, 2019, 115:1-11.
Sakai, A. et al., "Iron-based binary ferromagnets for transverse thermoelectric conversion," Nature, May 7, 2020, 581:1-18.
Sakuraba, S. et al., "Anomalous Nernst Effect in L10-FePt/MnGa Thermopiles for New Thermoelectric Applications," Applied Physics Express, 2013, 6:1-5.

* cited by examiner 10
12a
V
M
Ferromagnet 1
13a
11
ΔT_z
Ferromagnet 2
12
13
M_y
V_x 11
10
12a
13a
V_1
V_2
V_3
10 mm
FePt
12
Cr
13
60 FePt wires
10 mm FIG.4A
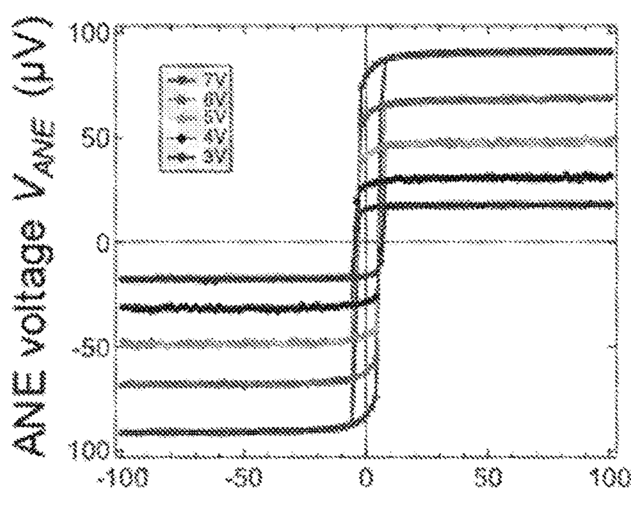
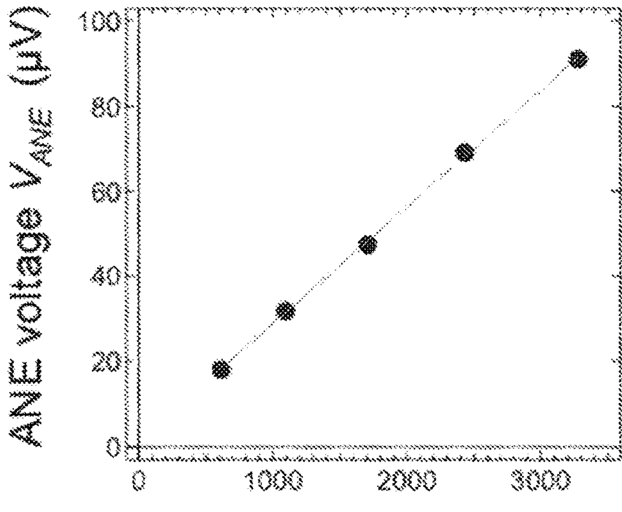
FIG.4B FIG.5A
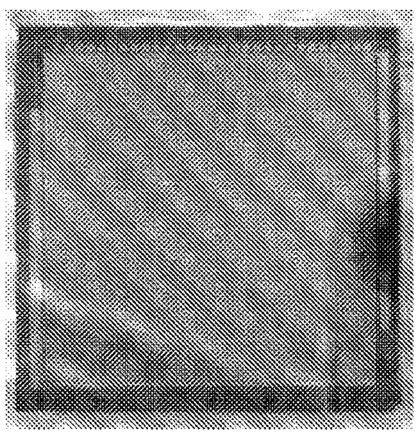
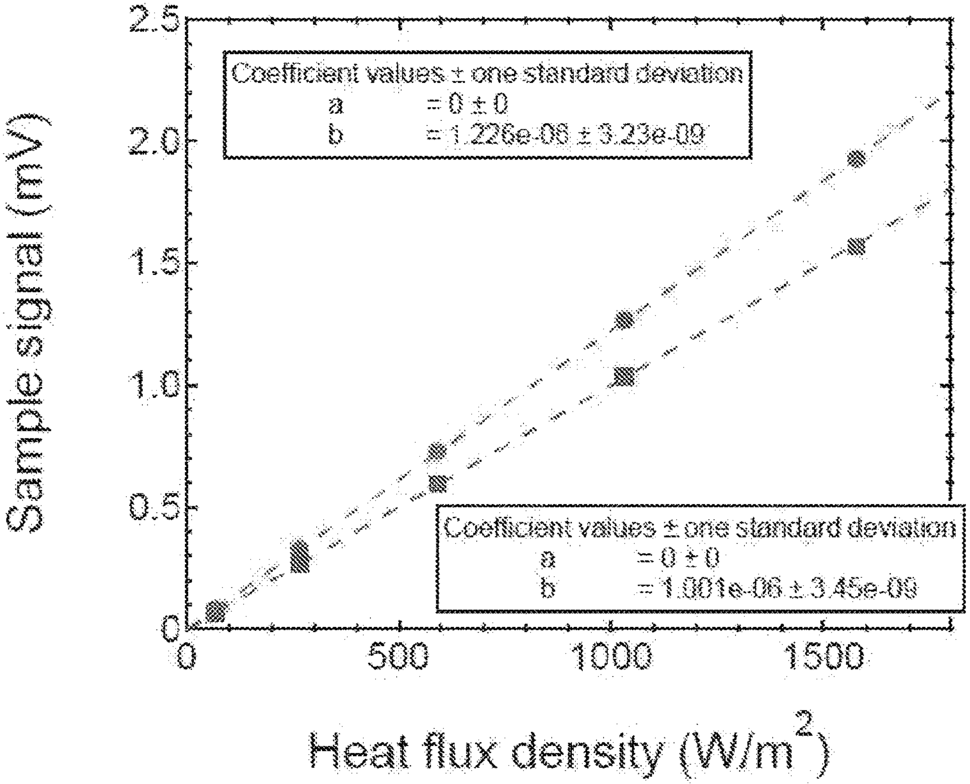
FIG.5B

THERMOELECTRIC POWER GENERATION DEVICE

CROSS-REFERENCE TO RELATED APPLICATIONS

This application is the U.S. national stage application of International Patent Application No. PCT/JP2022/023476, filed Jun. 10, 2022, which claims the benefit under 35 U.S.C. § 119 of Japanese Application No. 2021-098950, filed Jun. 14, 2021, the disclosures of each of which are incorporated herein by reference in their entirety.

TECHNICAL FIELD

The present invention relates to a thermoelectric power generation device, and more particularly to a thermoelectric power generation device having a thermopile structure that efficiently utilizes thermal energy/heat flow passing through a power generation module/heat flow sensor.

BACKGROUND ART

Research and development of basics and applications for realizing thermoelectric power generation and a heat flow sensor that utilize the thermoelectric effect "anomalous Nernst effect" appearing in a magnetic material is progressing. While an electromotive force is generated in the same direction as the heat flow in the general Seebeck effect, the most characteristic feature of the anomalous Nernst effect is that an electromotive force appears in the direction perpendicular to the heat flow. Using this makes thermoelectric power generation and heat flow sensing, which cannot be realized with the existing thermoelectric power generation using the Seebeck effect, possible.

In the anomalous Nernst effect, since the output appears in the in-plane direction with respect to the heat flow in the normal direction to the plane, the series voltage can be increased by arranging the magnetic wires in the plane and making a series a connection, but it is required that the magnitude or sign of the thermoelectric power due to anomalous Nernst of the magnetic material differs between "going" and "returning" or the magnetization is in the opposite direction.

Further, the anomalous Nernst effect in the magnetic material is a phenomenon that produces an electric field in the outer product direction ($\nabla T \times M$) of the magnetization and the temperature gradient. Using this allows the voltage to be amplified with a simple in-plane connection type thermopile (series connection of magnetic materials with positive and negative signs of thermoelectric power) structure, and thus, applications to thermoelectric power generation and heat flow sensors can be expected (FIGS. 3A and 3B, Patent Literature 1).

However, in order to construct a structure that does not waste thermal energy/heat flow in thermoelectric power generation and heat flow sensors that utilize the anomalous Nernst effect, there is a problem that the preparation thereof is not easy because it is necessary to use two types of magnetic materials with large positive and negative thermoelectric power in the thermopile or add control such that the magnetization of adjacent magnetic wires is directed in the opposite direction by magnetization reversal control.

Further, the large thermoelectric power of the anomalous Nernst effect reported so far is +3.4 μV/K with an FeAl alloy (Non-Patent Literature 1), +6 μV/K with a $Co_2MnGa$ Heusler alloy (Non-Patent Literature 2), +2.1 μV/K with an FeGa alloy (Non-Patent Literature 3), +3 μV/K with an $SmCo_5$ permanent magnet (Non-Patent Literature 4), and 3 to 6 μV/K with D03-$Fe_3Ga$ or $Fe_3Al$ (Non-Patent Literature 5), the material is limited to the one with a positive sign, and materials with a negative sign and large thermoelectric power due to the anomalous Nernst effect are still being explored. In this regard, most of the structures of the thermopiles that have been reported so far are structures in which connecting metal wires are formed of a non-magnetic material (uni-leg structure) (Non-Patent Literatures 1 and 5).

CITATION LIST

Patent Literature

Patent Literature 1: Japanese Patent No. 6079995

Non-Patent Literature

[Non-Patent Literature 1] W. Zhou, Y. Sakuraba Appl. Phys. Express 13, 043001 (2020).

[Non-Patent Literature 2] Sakai et al., Nature Physics, 14 1119 (2018)

[Non-Patent Literature 3] Nakayama et al., Phys. Rev. Mat. 3, 114412 (2019)

[Non-Patent Literature 4] Miura et al., Appl. Phys. Lett. 115, 222403 (2019)

[Non-Patent Literature 5] Sakai et al., Nature 581, 53-57 (2020)

[Non-Patent Literature 6] Sakuraba et al., Appl. Phys. Express 6, 033003 (2013).

DISCLOSURE OF INVENTION

Technical Problem

In an existing thermoelectric power generation device using thermoelectric power due to the anomalous Nernst effect, there is a problem that the heat flow/thermal energy passing through the non-magnetic material portion is wasted because it does not generate voltage output/electric power.

It is an object of the present invention to provide a thermoelectric power generation device having a thermopile structure that efficiently utilizes thermal energy/heat flow passing through a power generation module/heat flow sensor.

Solution to Problem

In order to solve the above-mentioned problem, the present inventors have devised a thermoelectric power generation device having a structure in which magnetic wires formed of one magnetic material with large thermoelectric power due to the anomalous Nernst effect are arrayed with extremely narrow gaps and connected in series with non-magnetic wires via an insulation film, as shown in FIGS. 1A and 1B.

With this structure, it is possible to cover substantially the entire region of the surface through which heat flow passes with one magnetic material, and improve the performance of a thermoelectric power generation module/heat flow sensor. It is also possible to obtain even higher performance by replacing the non-magnetic wire portion in the present invention with a magnetic material having thermoelectric power opposite to that of the magnetic wire portion.

[1] A thermoelectric power generation device according to the present invention includes: for example, as shown in FIGS. 1A and 1B, an insulation film 22 formed of an insulating material; a plurality of magnetic wires 21 that has a thin film fine line shape or a bar shape, is formed of a single magnetic material with large thermoelectric power due to an anomalous Nernst effect, and is arranged in parallel on one surface of the insulation film 22 to generate an anomalous Nernst electric field in an wire-extending direction 26; a plurality of non-magnetic wires 23 that has a thin film fine line shape or a bar shape, is formed of a non-magnetic material, and is arranged in parallel on the other surface of the insulation film 22 so as to be parallel or oblique to a direction in which the plurality of magnetic wires 21 is extended; through contact holes that pass through the insulation film 22 and electrically connect the plurality of magnetic wires 21 and the plurality of non-magnetic wires 23 so that a first magnetic wire 21*a* and a second magnetic wire 21*b* adjacent to each other, of the plurality of magnetic wires 21, can be connected in series via the non-magnetic wire 23; and a substrate 20 that is formed of an insulating material or a conductive material coated with an insulating material, holds a stacked body of the plurality of magnetic wires 21, the insulation film 22, and the plurality of non-magnetic wires 23, and is in thermal contact with the stacked body.

[2] In the thermoelectric power generation device according to the present invention, both end portions in an wire-extending direction of the non-magnetic wire 23*a* that connect the first and second magnetic wires 21*a* and 21*b* adjacent to each other may be respectively electrically connected to one end portion of the first magnetic wire 21*a* in the wire-extending direction and the other end portion of the second magnetic wire 21*b* in the wire-extending direction via the through contact holes 24 filled with a conductive material.

[3] In the thermoelectric power generation device according to the present invention, favorably, the non-magnetic material of the plurality of non-magnetic wires 23 may be any one of Cu, Ag, Au, Al, Rh, W, Mo, Pt, Pd, and alloy materials containing these.

[4] A thermoelectric power generation device according to the present invention includes: for example, as shown in FIGS. 2A and 2B, an insulation film 22 formed of an insulating material; a plurality of magnetic wires 21 that has a thin film fine line shape or a bar shape, is formed of a single magnetic material with large thermoelectric power due to an anomalous Nernst effect, and is arranged in parallel on one surface of the insulation film 22; a plurality of diamagnetic wires 27 that has a thin film fine line shape or a bar shape, is formed of a magnetic material having thermoelectric power opposite in sign to the magnetic material forming the plurality of magnetic wires, and is arranged in parallel on the other surface of the insulation film 22 so as to be parallel or oblique to a direction in which the plurality of magnetic wires 21 is extended; through contact holes 24 that pass through the insulation film 22 and electrically connect the plurality of magnetic wires 21 and the plurality of diamagnetic wires 27 so that a first magnetic wire 21*a* and a second magnetic wire 21*b* adjacent to each other, of the plurality of magnetic wires 21, can be connected in series via one of the plurality of diamagnetic wires 27; and a substrate 20 that is formed of an insulating material or a conductive material coated with an insulating material, holds a stacked body of the plurality of magnetic wires 21, the insulation film 22, and the plurality of diamagnetic wires 27, and is in thermal contact with the stacked body.

[5] In the thermoelectric power generation device according to the present invention, both end portions in an wire-extending direction of the diamagnetic wire 27*a* that connect the first and second magnetic wires 21*a* and 21*b* adjacent to each other may be respectively electrically connected to one end portion of the first magnetic wire 21*a* in the wire-extending direction and the other end portion of the second magnetic wire 21*b* in the wire-extending direction via the through contact holes 24 filled with a conductive material.

[6] In the thermoelectric power generation device according to the present invention, the magnetic material forming the plurality of magnetic wires 21 may have positive thermoelectric power, and the magnetic material forming the plurality of diamagnetic wires 27 may have negative thermoelectric power.

[7] In the thermoelectric power generation device according to the present invention, the magnetic material forming the plurality of magnetic wires 21 may have negative thermoelectric power, and the magnetic material forming the plurality of diamagnetic wires 27 may have positive thermoelectric power.

[8] In the thermoelectric power generation device according to the present invention, favorably, an interval between the plurality of magnetic wires 21 may be narrower than at least one of a length or a width of the magnetic wire 21.

[9] In the thermoelectric power generation device according to the present invention, favorably, the magnetic material forming the plurality of magnetic wires 21 may be any one of Fe—Al, Fe—Ga, Fe—Sn, Fe—Pt, Mn—Ga, Mn—Ge, Mn—Sn, Ni—Pt, Co—Gd, $Fe_4N$, an $Mn_3AN$ (A=Mn, Pt, or Ni) or $Co_2YZ$ (Y=Ti, V, Cr, Mn, or Fe; Z=Ga, Ge, Al, Si, Sn, or Sb) Heusler alloy, an Sm—Co permanent magnet material, an Nd—Fe—B permanent magnet material, and GaMnAs.

[10] In the thermoelectric power generation device according to the present invention, favorably, the insulating material forming the insulation film 22 may be any one of MgO, Si—O, Si—N, Al—O, Al—N, BN, and C.

[11] In the thermoelectric power generation device according to the present invention, the substrate may be favorably formed of one of MgO, silicon with thermal oxide film, Si—O, Si—N, Al—O, Al—N, SiC, sapphire, glass, polyimide, polyethylene naphthalate, and diamond as the insulating material, or one of silicon, Cu, Ag, Au, Al, Rh, W, Mo, Pt, and Pd as the conductive material coated with an insulating material.

[12] In the thermoelectric power generation device according to the present invention, favorably, when the thermoelectric power generation device is used as a heat flow sensor, the magnetic wire 21 may have a thin film fine line shape and have a width W of 10 nm to 1 mm, a thickness T of 1 nm to 100 μm, and a length L of 1 μm to 10 cm.

[13] In the thermoelectric power generation device according to the present invention, favorably, when the thermoelectric power generation device is used as a thermoelectric power generation module, the magnetic wire 21 may have a bar shape and have a width W of 10 μm to 5 mm, a thickness T of 10 μm to 1 cm, and a length L of 1 mm to 100 cm.

[14] In the thermoelectric power generation device according to the present invention, favorably, a film thickness of the insulation film 22 may be 1 nm to 1 cm.

[15] In the thermoelectric power generation device according to the present invention, favorably, a thickness of the substrate 20 may be 3 μm to 3 mm.

Advantageous Effects of Invention

In accordance with the thermoelectric power generation device according to the present invention, it is possible to construct a thermoelectric power generation module/heat flow sensor utilizing the anomalous Nernst effect with one magnetic material, and prepare a thermoelectric power generation module/heat flow sensor that does not lose thermal energy/heat flow in terms of the device structure if one magnetic material exhibiting a larger anomalous Nernst effect is realized.

In the thermoelectric power generation device according to the present invention, favorably, when using the diamagnetic wire 27 formed of a magnetic material having thermoelectric power opposite in sign to the magnetic material of the magnetic wire 21 as in [4], it is possible to further improve the sensitivity of the heat flow sensor or the power generation performance of the power generation module as compared with the case of the non-magnetic wire 23.

BRIEF DESCRIPTION OF DRAWINGS

FIGS. 4A and 4B are graphs showing an evaluation result of the heat flow sensor performance of a device prepared as an Example 1 of the present invention.

FIGS. 5A and 5B are external appearance photographs (FIG. 5A) of a heat flow sensor of 30 square mm size prepared as an Example 2 of the present invention and an evaluation result (FIG. 5B) of its performance.

MODE(S) FOR CARRYING OUT THE INVENTION

Definitions of technical terms used in this specification will be descried below.

(1) Nernst Effect

Figures 3A, 3B:
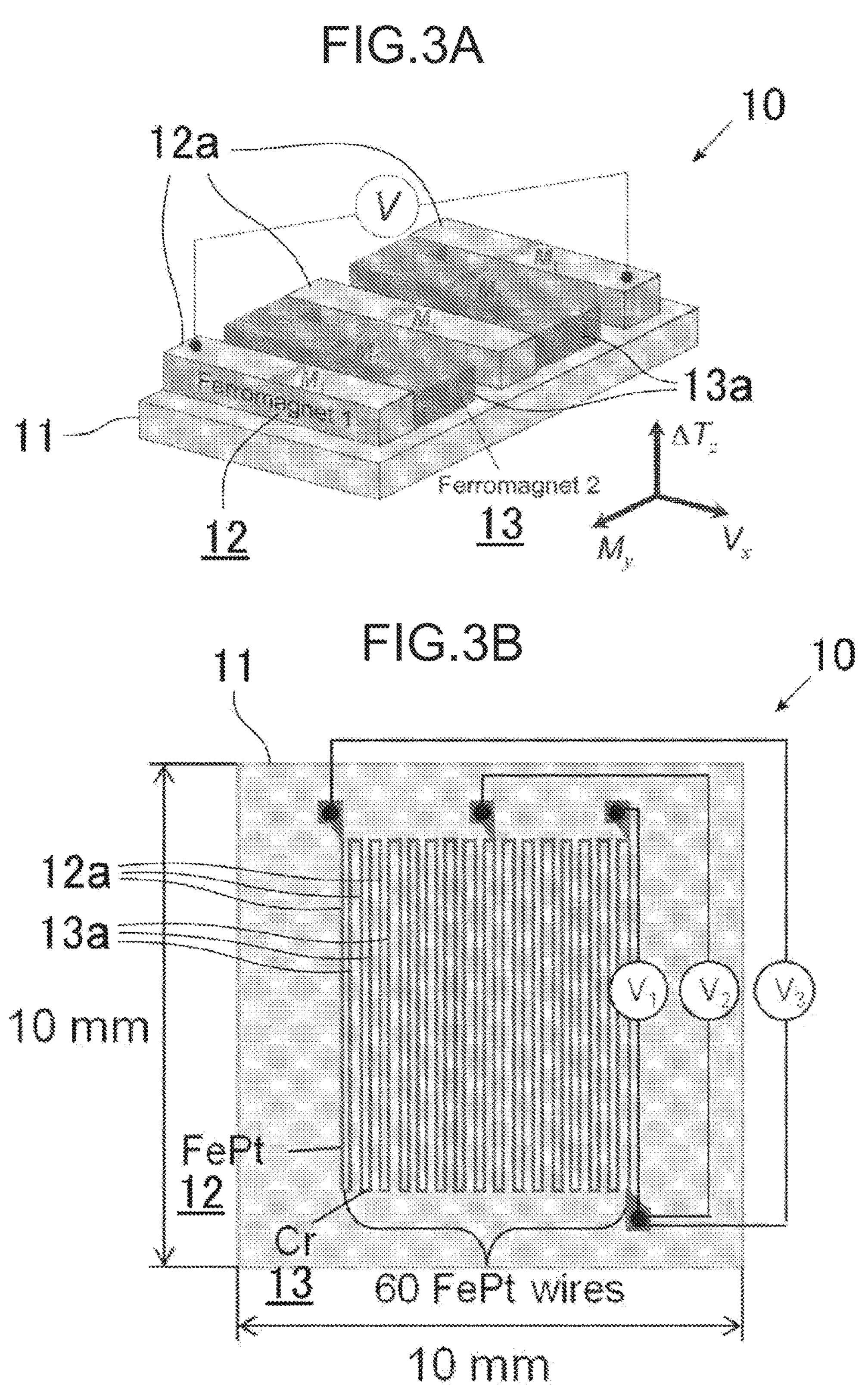
FIGS. 3A and 3B are configuration diagrams showing a conceptual configuration for describing an existing a thermoelectric converter based on the anomalous Nernst effect.

The Nernst effect refers to a phenomenon that when a magnetic field is applied in a direction (My) perpendicular to a direction of heat flow (ΔTz) to a conductor (metal or semiconductor) in which there is a temperature gradient and heat is flowing, a potential difference is caused in a direction (Vx) vertical to both. Here, the coordinate systems Vx, My, and ΔTz are coordinate systems as shown in FIG. 3A.

(2) Anomalous Nernst Effect (ANE)

The anomalous Nernst effect is a phenomenon that when a metal or a semiconductor with spontaneous magnetization has a temperature difference in a direction perpendicular to the spontaneous magnetization, a potential difference is caused in the outer product direction thereof. For this reason, when using the anomalous Nernst effect, for example, a voltage in the My in-plane direction can be obtained simply by applying a thermal gradient in the ΔTz direction normal to the plane to a ferromagnetic material having magnetization in the My direction, and a large voltage can be easily obtained simply by increasing the distance in the Vx direction. Further, the anomalous Nernst effect has characteristics that the direction in which a current flows differs depending on the orientation of the spontaneous magnetization, the power generation efficiency for the figure of merit is higher than the Seebeck effect, the temperature difference can be freely designed because the output voltage is proportional to the length in the direction perpendicular to the temperature difference, and it is unnecessary to apply a magnetic field if residual magnetization is used, as compared with the normal Nernst effect.

(3) The Seebeck effect is a phenomenon that the temperature difference of the metal or semiconductor is directly converted into a voltage, and is a type of thermoelectric effect. It is characterized in that the sign of the Seebeck coefficient differs depending on whether the carriers are electrons or holes.

Note that "to" indicating the numerical value range indicates the numerical value range between the lower limit value and the upper limit value, and represents the range of the lower limit value or more and the upper limit value or less in this specification unless otherwise specified.

Figures 1A, 1B:
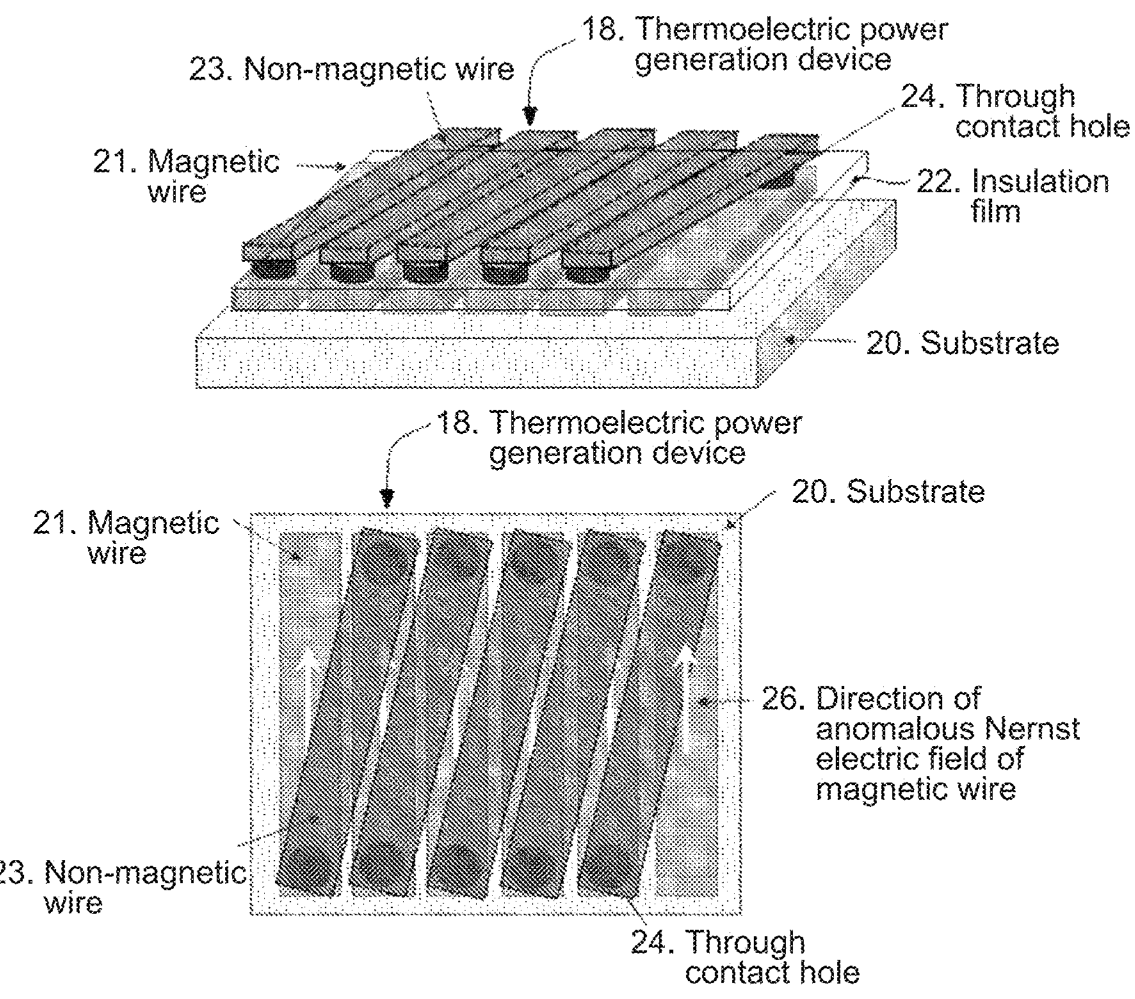
FIGS. 1A and 1B are configuration diagrams showing a conceptual configuration of a thermoelectric power generation device showing an embodiment of the present invention.

FIGS. 1A and 1B are configuration diagrams showing a conceptual configuration of a thermoelectric power generation device showing an embodiment of the present invention, FIG. 1A shows a perspective view, and FIG. 1B shows a plan view.

In FIGS. 1A and 1B, a thermoelectric power generation device 18 includes a substrate 20, a plurality of magnetic wires 21, an insulation film 22, a plurality of non-magnetic wires 23, and through contact holes 24. The present invention has a structure (thermopile structure) in which the plurality of magnetic wires 21 is connected in series via the plurality of non-magnetic wires 23.

The substrate 20 holds a stacked body of the plurality of magnetic wires 21, the insulation film 22, and the plurality of non-magnetic wires 23. FIGS. 1A and 1B show a case where the plurality of magnetic wires 21 is arranged on the joint surface side with the substrate 20. However, the present invention is not limited thereto, and the stacking order of the stacked body of the plurality of magnetic wires 21, the insulation film 22, and the plurality of non-magnetic wires 23 may be reversed to arrange the plurality of non-magnetic wires 23 on the joint surface side with the substrate 20.

The substrate 20 is formed of a conductive material that is electrically insulating or coated with an insulator. The material forming the substrate 20 is favorably one having a high a thermal conductivity, is favorably, but not limited to, an MgO substrate, and may be any one of silicon with thermal oxide film, Si—O, Si—N, Al—O, Al—N, SiC, sapphire, glass, polyimide, polyethylene naphthalate, and diamond. Alternatively, using, as the conductive material coated with an insulating material, silicon, Cu, Ag, Au, Al, Rh, W, Mo, Pt, Pd foil, or the like, a flexible substrate can be obtained.

The film thickness of the substrate 20 may be 1 μm to 1 m. Favorably, the film thickness of the substrate 20 may be 3 μm to 3 mm as a suitable range and 5 μm to 1 mm as the optimal range.

The plurality of magnetic wires 21 is formed of a single magnetic material with large thermoelectric power due to the anomalous Nernst effect and includes a plurality of first and second magnetic wires 21*a* and 21*b* that have a thin film fine line shape or a bar shape and are arranged in parallel. The plurality of magnetic wires 21 is arranged in a longitudinal stripe pattern on one surface of the insulation film 22, e.g., on the side of the substrate 20. As the magnetic material, all magnetic materials that produce the anomalous Nernst effect can be used. Favorably, Fe—Al, Fe—Ga, Fe—Sn, Fe—Pt, Mn—Ga, Mn—Ge, Mn—Sn, Ni—Pt, Co—Gd, $Fe_4N$, an $Mn_3AN$ (A=Mn, Pt, Ni) or $Co_2YZ$ (Y=Ti, V, Cr, Mn, Fe; Z—Ga, Ge, Al, Si, Sn, Sb) Heusler alloy, Sm—Co, an Nd—Fe—B permanent magnet material, GaMnAs, or the like having a large anomalous Nernst effect is desirable.

The interval between the plurality of magnetic wires 21 may be narrower than at least one of the length or the width of the magnetic wire 21 from the viewpoint of output voltage.

The plurality of non-magnetic wires 23 is formed of a non-magnetic material, includes a plurality of non-magnetic wires 23*a* having a thin film fine line shape or a bar shape arranged in parallel, and is arranged on the other surface of the insulation film 22 so as to be parallel or oblique to the direction in which the plurality of magnetic wires 21 is extended. That is, the plurality of non-magnetic wires 23 is arranged in a longitudinal stripe pattern parallel to the magnetic wires 21 or an oblique longitudinal stripe pattern.

The non-magnetic wire 23*a* has a structure that connects the first and second magnetic wires 21*a* and 21*b* adjacent to each other, of the plurality of magnetic wires 21, at both ends in the wire-extending direction thereof.

The non-magnetic wire 23*a* desirably has an electric resistance so small that it can be ignored compared with those of the first and second magnetic wires 21*a* and 21*b*, and has an electrical contact resistance smaller than the resistance of the magnetic wire portion between the first and second magnetic wires 21*a* and 21*b*.

Although all electrically conductive materials can be used as the non-magnetic material, materials having high electrical conductivity are favorable and Cu, Ag, Au, Al, Rh, W, Mo, Pt, Pd, alloy materials containing them, and the like are desirable.

The insulation film 22 is formed of an insulating material and is positioned on the facing surface of the plurality of magnetic wires 21 and the plurality of non-magnetic wires 23 to insulate the plurality of magnetic wires 21 and the plurality of non-magnetic wires 23. Although all electrically insulating materials can be used as the insulating material, those having a high thermal conductivity are favorable and MgO, Si—O, Si—N, Al—O, Al—N, BN, C, and the like are desirable. It is favorable that the insulation film 22 is sufficiently thin within a range that does not cause electrical contact except through the through contact holes 24 connecting the non-magnetic wire 23*a* and the first and second magnetic wires 21*a* and 21*b*. For example, the film thickness may be 1 nm to 1 cm. Favorably, the film thickness of the insulation film 22 may be 10 nm to 5 mm as the suitable range and 30 nm to 1 mm as the optimal range. It is favorable that the insulation film 22 is sufficiently thin within a range that does not cause electrical contact except through the through contact holes 24 connecting the non-magnetic wires 23 and the magnetic wires 21.

The through contact holes 24 pass through the insulation film 22 and electrically connect the plurality of magnetic wires 21 and the plurality of non-magnetic wires 23 so that the first magnetic wire 21*a* and the second magnetic wire 21*b* adjacent to each other, of the plurality of magnetic wires 21, can be connected in series via the non-magnetic wire 23.

The through contact holes 24 are typically provided in the vicinity of both end portions of the insulation film 22 in the direction in which the magnetic wires 21*a* are extended, and have a shape that penetrates the insulation film 22 such that the portion of the first magnetic wire 21*a* in the vicinity of the end portion located on one surface of the insulation film 22 and the portion of the non-magnetic wire 23*a* in the vicinity of the end portion located on the other surface of the insulation film 22 are connected to each other.

The plurality of non-magnetic wires 23 arranged in the oblique longitudinal stripe pattern can have a structure in which the first magnetic wire 21*a* and the second magnetic wire 21*b* arranged adjacent to each other are connected in series via the through contact holes 24 at both end portions of the non-magnetic wire 23*a*.

Both end portions of the non-magnetic wire 23*a* in the wire-extending direction connecting the first and second magnetic wires 21*a* and 21*b* adjacent to each other may be respectively electrically connected one end portion of the first magnetic wire 21*a* in the wire-extending direction and the other end portion of the second magnetic wire 21*b* in the wire-extending direction via the through contact holes 24 filled with a conductive material.

In the case where the film thickness of the insulation film 22 is small, the through contact holes 24 may be those obtaining conductivity by bending the end portion of the magnetic wire 21*a* and the end portion of the non-magnetic wire 23*a* and bringing them into direct contact with each other. Further, in the case where the film thickness of the insulation film 22 is large, the end portion of the first magnetic wire 21*a* and the facing surface of the end portion of the non-magnetic wire 23*a* may be electrically connected to each other by filling the through contact holes 24 with a conductive material such as silver paste.

In the thermoelectric power generation device configured in this way, since the magnetic wires can be arranged at high density, high sensitivity can be obtained in the case where the thermoelectric power generation device is applied to a heat flow sensor and high output voltage can be obtained in the case where the thermoelectric power generation device is applied to a power generation module.

In the thermoelectric power generation device according to the present invention, favorably, in the case where the thermoelectric power generation device is used as a heat flow sensor, the magnetic wire 21 has a thin film fine line shape and has a width W of 10 nm to 1 mm, a thickness T of 1 nm to 100 μm, and a length L of 1 μm to 10 cm.

Favorably, in the heat flow sensor, the width W, the thickness T, and the length L of the magnetic wire 21 are respectively 1 μm to 1 mm, 10 nm to 10 μm, and 100 μm to 5 cm as the suitable range and 10 μm to 500 μm, 100 nm to 5 μm, and 1 mm to 3 cm as the optimal range.

In the thermoelectric power generation device according to the present invention, favorably, in the case where the thermoelectric power generation device is used as a thermoelectric power generation module, the magnetic wire 21 has a bar shape and has a width W of 10 μm to 5 mm, a thickness T of 10 μm to 1 cm, and a length L of 1 mm to 100 cm.

Favorably, in the thermoelectric power generation module, the width W, the thickness T, and the length L of the magnetic wire 21 are respectively 100 μm to 3 mm, 100 μm to 5 mm, and 3 mm to 50 cm as the suitable range and 300 μm to 2 mm, 500 μm to 3 mm, and 5 mm to 30 cm as the optimal range.

Figures 2A, 2B:
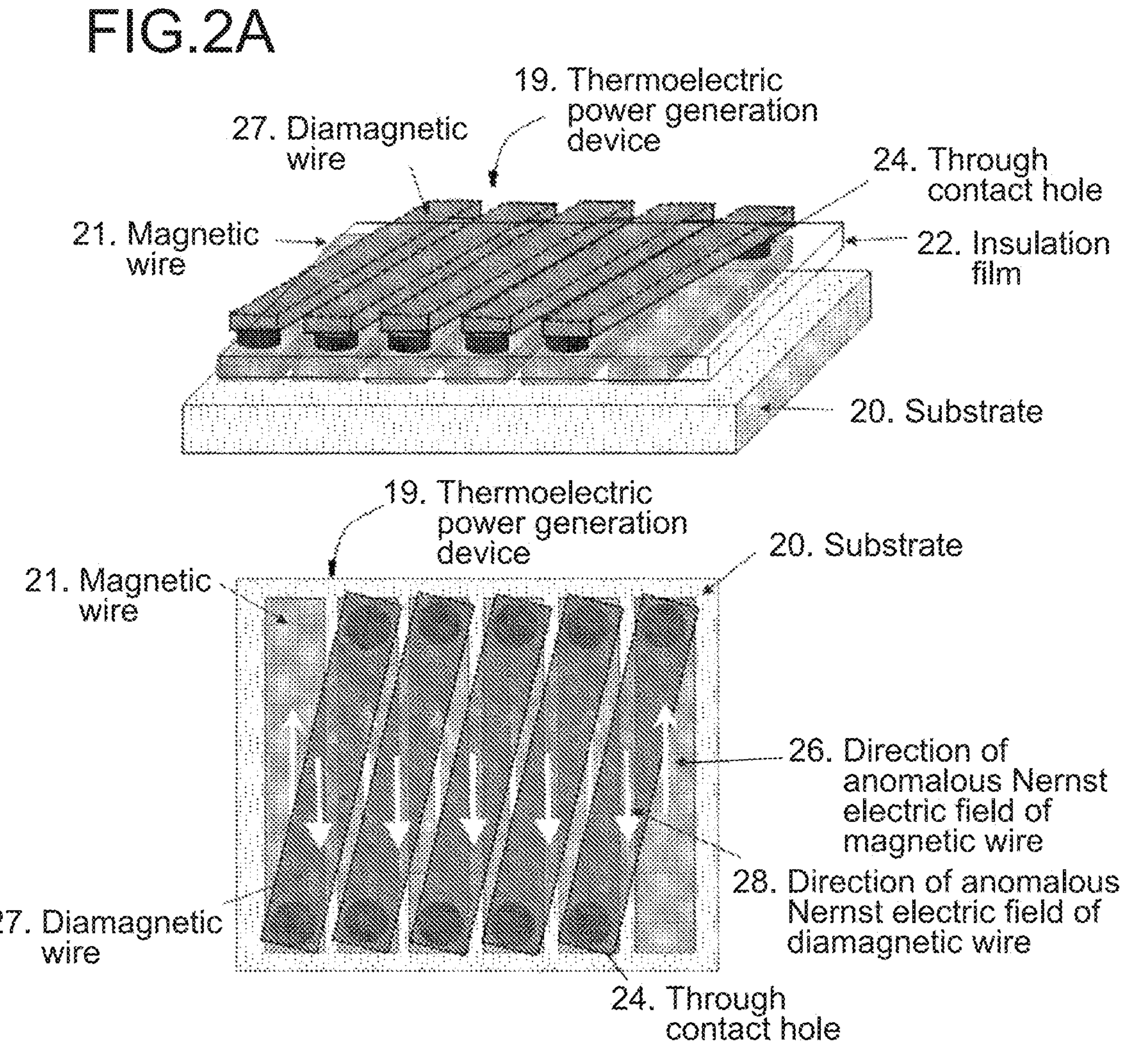
FIGS. 2A and 2B are configuration diagrams showing a conceptual configuration of a thermoelectric power generation device showing another embodiment of the present invention.

FIGS. 2A and 2B are configuration diagrams showing a conceptual configuration of a thermoelectric power generation device showing another embodiment of the present invention, FIG. 2A is a perspective view, and FIG. 2B is a plan view. Note that in FIGS. 2A and 2B, those having the same operations and effects as those of the matters specifying the invention in FIGS. 1A and 1B described above are denoted by the same reference symbols and description thereof is omitted.

In this embodiment, a thermoelectric power generation device 19 that includes, instead of the non-magnetic wire 23*a* in the thermoelectric power generation device 18, diamagnetic wires 27 obtained by replacing the magnetic material of the magnetic wire 21 with a magnetic material opposite in sign to the magnetic material of the magnetic wire 21 is shown.

For example, the magnetic material forming the plurality of magnetic wires 21 may have positive thermoelectric power and the magnetic material forming the plurality of diamagnetic wires 27 may have negative thermoelectric power.

At this time, in the case where the magnetic wire 21 is one of Fe—Al, Fe—Ga, Fe—Sn, Fe—Pt, Mn—Sn, $Fe_4N$, an $Mn_3AN$ (A=Mn, Pt, or Ni) or $Co_2YZ$ (Y=Ti, V, Cr, Mn, or Fe; Z=Ga, Ge, Al, Si, Sn, or Sb) Heusler alloy, and an Sm—Co permanent magnet material as a material having positive thermoelectric power, the diamagnetic wire 27 may be one of Mn—Ga, Mn—Ge, an Nd—Fe—B permanent magnet material, and GaMnAs as a material having a negative thermoelectric power.

For example, the magnetic material forming the plurality of magnetic wires 21 may have negative thermoelectric power, and the magnetic material forming the plurality of diamagnetic wires 27 may have positive thermoelectric power.

At this time, in the case where the magnetic wire 21 is one of Mn—Ga, Mn—Ge, and an Nd—Fe—B permanent magnet material as a material having negative thermoelectric power, the diamagnetic wire 27 may be one of Fe—Al, Fe—Ga, Fe—Sn, Fe—Pt, Mn—Sn, a $Co_2YZ$ (Y=Ti, V, Cr, Mn, or Fe; Z=Ga, Ge, Al, Si, Sn, or Sb) Heusler alloy, and an Sm—Co permanent magnet material as a material having a positive thermoelectric power.

That is, the thermoelectric power generation device 19 includes the substrate 20, the plurality of magnetic wires 21, the plurality of diamagnetic wires 27, and the through contact holes 24, wherein the substrate 20 is formed of an insulating material, wherein the insulation film 22 is formed of an insulating material, wherein the plurality of magnetic wires 21 is formed of a single magnetic material having large thermoelectric power due to the anomalous Nernst effect, and includes the plurality of first and second magnetic wires 21*a* and 21*b* for generating an anomalous Nernst electric field in the wire-extending direction 26 that have a thin film fine line shape or a bar shape and are arranged in parallel on one surface of the insulation film 22 in a longitudinal stripe pattern, wherein the plurality of diamagnetic wires 27 is formed of a magnetic material having thermoelectric power opposite in sign to the magnetic material of the magnetic wire 21*a*, and the plurality of diamagnetic wires 27*a* that has a thin film fine line shape or a bar shape and is arranged in parallel on the other surface of the insulation film 22 so as to be parallel or oblique to the plurality of magnetic wires 21 (arrayed in a parallel longitudinal stripe pattern or an oblique longitudinal stripe pattern), and wherein the through contact holes 24 are provided in the insulation film 22 in the vicinity of both end portions of the magnetic wire 21*a*.

The substrate 20 has the mechanical durability for holding a stacked body of the magnetic wire 21, the insulation film 22, and the diamagnetic wire 27 and is in thermal contact with the stacked body, and the through contact holes 24 penetrate the insulation film 22 such that portions of the magnetic wire in the vicinity of end portions located on one surface of the insulation film 22 and portions of the non-magnetic wire in the vicinity of end portions located on the other surface of the insulation film 22 are connected to each other. The plurality of diamagnetic wires 27 is typically arranged such that the first magnetic wire 21*a* and the second magnetic wire 21*b* arranged adjacent to each other are connected in series via the through contact holes 24 at both end portions of the diamagnetic wire 27*a* in the wire-extending direction.

FIGS. 3A and 3B show a conceptual configuration for describing an existing thermoelectric conversion device based on the anomalous Nernst effect, and shows a basic structure of thermoelectric power generation/heat flow sensor using the anomalous Nernst effect. FIG. 3A shows a perspective view, and FIG. 3B shows a plan view.

As shown in FIGS. 3A and 3B, an existing thermoelectric power generation device 10 includes a substrate 11, a generator 12, and a connector 13.

At least the surface layer of the substrate 11 is formed of MgO. The substrate 11 includes, for example, a single layer of MgO or an MgO layer stacked on an Au layer.

The generator 12 includes a plurality of thin lines 12*a* arranged in parallel (Vx) along the surface of the substrate 11. Each of the thin lines 12*a* is formed of a ferromagnetic material of an $L1_0$-type ordered alloy having high magnetic anisotropy and is magnetized in the same direction (My). In a specific example shown in FIGS. 3A and 3B, each thin line 12*a* is formed by forming fine lines of the FePt thin film deposited on the substrate 11, and is magnetized in the width direction (My). The generator 12 is configured to generate power with a temperature difference (ΔTz) in the direction perpendicular to the direction of the magnetization due to the anomalous Nernst effect.

The connector 13 includes a plurality of thin lines 13*a* arranged between the corresponding thin lines 12*a* in parallel with each thin line 12*a* of the generator 12 along the surface of the substrate 11. Each thin line 13*a* of the connector 13 electrically connects one end portion of each thin line 12*a* of the generator 12 and the other end portion of the thin line 12*a* adjacent to each thin line 12*a* on one side to each other. As a result, the connector 13 electrically connects the respective thin lines 12*a* of the generator 12 in series. The connector 13 is formed of a ferromagnetic material magnetized in the direction opposite to the direction of the magnetization of each thin line 12*a* in the specific example shown in FIG. 3A, and the connector 13 is formed of Cr that is a non-magnetic material in the specific example shown in FIG. 3B. Note that the connector 13 may be formed of a ferromagnetic material having a Nernst coefficient opposite in sign to that of each thin line 12*a*.

In the specific example shown in FIG. 3B, the size of the substrate is 10 mm×10 mm, and the number of thin lines 12_a_ of the generator 12 is 60.

Next, the effects will be described.

The thermoelectric power generation device 10 can be configured with a simpler structure, as compared with one using the Seebeck effect, because a potential difference is generated in the direction perpendicular to the temperature difference when using the anomalous Nernst effect. Therefore, it can be relatively easily prepared, and it is also possible to realize a power generation device using a large area. However, in an existing thermoelectric power generation device using thermoelectric power due to the anomalous Nernst effect shown in a Comparative Example, there is a problem that the preparation thereof is not easy because it is necessary to use two types of magnetic materials with large positive and negative thermoelectric power in the thermopile or add control such that the magnetization of adjacent magnetic wires is directed in the opposite direction by magnetization reversal control.

Further, since the thermoelectric power generation device 10 uses the anomalous Nernst effect, it has higher power generation efficiency for the same figure of merit than one using the Seebeck effect, and it is possible to increase the thermoelectric conversion efficiency. Further, unlike the normal Nernst effect, it is possible to generate electricity without applying an external magnetic field, by using the coercive force and exchange bias.

Since the thermoelectric power generation device 10 uses an $L1_0$-type ordered alloy having high magnetic anisotropy for the generator 12, which is magnetized in the width direction of each thin line 12_a_, for example, spontaneous magnetization can be obtained even if the width of the thin line 12_a_ is narrowed to several tens of nanometers. For this reason, even with a small area, a large voltage exceeding mV can be realized, and miniaturization is effective.

Note that in the above embodiment, Fe—Al, Fe—Ga, Fe—Sn, Fe—Pt, Mn—Sn, a $Co_2YZ$ (Y=Ti, V, Cr, Mn, Fe, Z=Ga, Ge, Al, Si, Sn, Sb) Heusler alloy, and an Sm—Co permanent magnet material are shown as a material having positive thermoelectric power, and Mn—Ga, Mn—Ge, and an Nd—Fe—B permanent magnet material are shown as a negative thermoelectric power. However, it has been found that the sign of the thermoelectric power is not determined only from the elemental composition of the above materials. That is, even in the same material system, the sign of the thermoelectric power is positive and negative (e.g., in the case of Fe—Ga, negative in the case where the concentration of Ga is low). In this case, the combination of magnetic materials may be determined giving priority to the case where the sign of the thermoelectric power is positive and negative.

Examples of this embodiment will be described below. However, the present invention is not limited to the configuration described below.

FIGS. 4A and 4B are graphs showing an evaluation result of the performance of a heat flow sensor prepared as an Example 1 of the present invention.

Here, silicon with thermal oxide film having a thickness of 500 μm, $Fe_{72}Ga_{28}$ having a thickness of 30 nm, a width of 200 μm, and a length of 6 mm, $SiO_2$ of 300 nm, and Cu having a thickness of 350 nm and a width of 40 μm were respectively used for the substrate 20, the magnetic wire 21, the insulation film 22, and the non-magnetic wire 23, and a sample was prepared by patterning using photolithography such that 20 $Fe_{72}Ga_{28}$ lines are connected in series.

FIG. 4B shows the voltage signal (mV) of the sample due to the anomalous Nernst effect with respect to the heat flux density ($W/m^2$). As a result, a sensitivity of 0.027 $\mu V/(W \cdot m^{-2})$ was realized, a series connection of 20 $Fe_{72}Ga_{28}$ was constructed, and it was confirmed that a high sensitivity was obtained. Note that the inner diameter of the through contact holes 24 is set to 160 μm.

This sensitivity indicates that a sensitivity of 0.10 $\mu V/(W \cdot m^{-2})$ is obtained per 1 $cm^2$ when normalized by the effective area of the sensor. This sensitivity per area is clearly larger than, for example, 0.04 $\mu V/(W \cdot m^{-2})$ per 1 $cm^2$ reported in Non-Patent Literature 2, which is the sensitivity of the sensor having an existing structure using $Fe_{81}Al_{19}$ having higher thermoelectric power than $Fe_{72}Ga_{28}$, and indicates that the present invention is effective for increasing the sensitivity per area.

Example 2

FIGS. 5A and 5B show an external appearance photograph (FIG. 5A) of a heat flow sensor of a 30 square mm size prepared as an Example 2 of the present invention and an evaluation result (FIG. 5B) of its performance.

In the Example 2, silicon with thermal oxide film having a thickness of 500 μm, $Fe_{72}Ga_{28}$ having a thickness of 200 nm, a width of 180 μm, and a length of 30 mm, $SiO_2$ of 200 nm, and Au having a thickness of 100 nm and a width of 110 μm were respectively used for the substrate 20, the magnetic wire 21_a_, the insulation film 22, and the non-magnetic wire 23_a_, and a sample was prepared by patterning using photolithography such that 150 $Fe_{72}Ga_{28}$ lines are connected in series. Note that here, the non-magnetic wire 23_a_ is arranged in parallel with the magnetic wire 21_a_.

FIG. 5B is a graph showing the voltage signal (mV) of the sample due to the anomalous Nernst effect with respect to the heat flux density ($W/m^2$) given to the prepared sample.

As a result, the sensitivity of 1.226 $\mu V/(W \cdot m^{-2})$ in the case where measurement was performed in the saturated state with an applied external magnetic field (indicated by circles in the figure) and the sensitivity of 1.001 $\mu V/(W \cdot m^{-2})$ in the case where measurement was performed in the residual magnetization state without an external magnetic field (indicated by squares in the figure) were realized, a series connection of 150 $Fe_{72}Ga_{28}$ was constructed, and it was confirmed that a sensitivity as high as approximately 25 to 30 times the sensitivity of 0.04 $\mu V/(W \cdot m^{-2})$ reported in the Non-Patent Literature 1 was obtained.

Figure 6A:
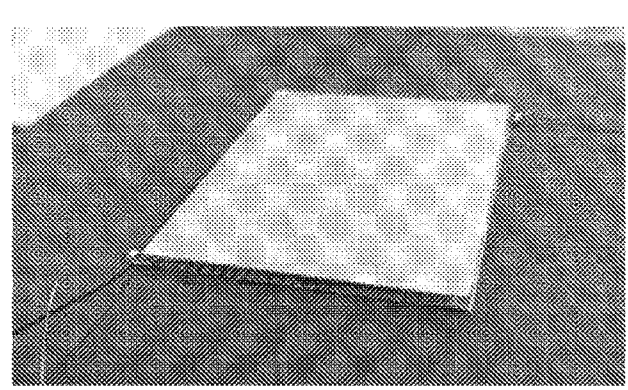
FIGS. 6A-6C are external appearance photographs (FIG. 6A) of a heat flow sensor of 30 square mm size prepared as an Example 3 of the present invention, its internal photograph (FIG. 6B), and a graph (FIG. 6C) showing an evaluation result of its performance.
Figure 6B:
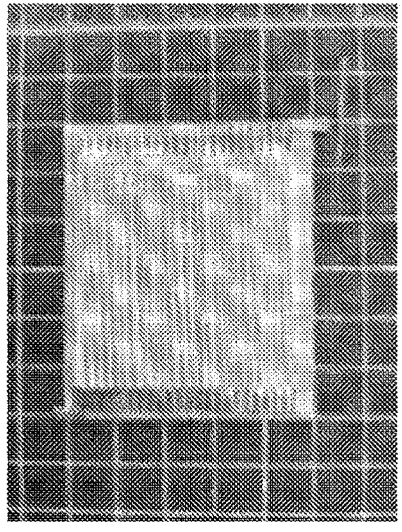
Figure 6C:
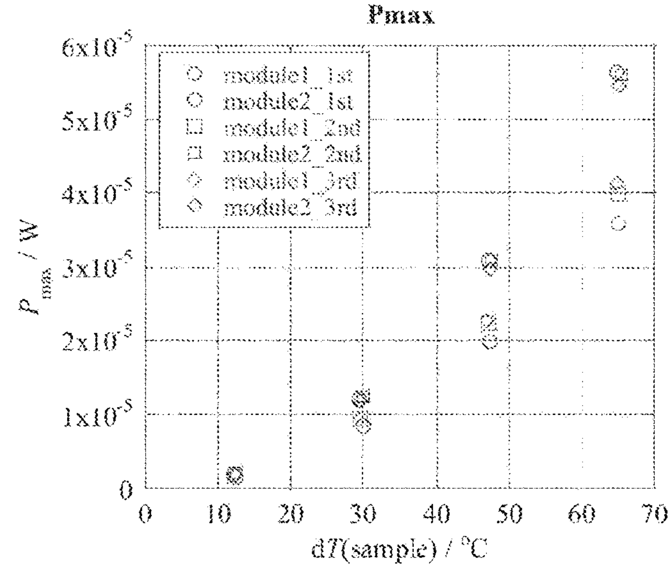

FIGS. 6A-6C are external appearance photographs (FIG. 6A) of an anomalous Nernst thermoelectric power generation module of a 55×23 square mm size prepared as an Example 3 of the present invention, its internal photograph (FIG. 6B), and a graph (FIG. 6C) showing an evaluation result of its performance. An Al—N substrate having a thickness of 500 μm, an $SmCo_5$ permanent magnet having a thickness of 1.5 mm, a width of 1.4 mm, and a length of 55 mm, a silicon bond of approximately 500 μm, and Al having a thickness of 30 μm and a width of 300 μm were respectively used for the substrate 20, the magnetic wire 21_a_, the insulation film 22, and the non-magnetic wire 23_a_, and 24 $SmCo_5$ lines were wired so as to be connected in series. After that, an Al—N substrate was disposed also on the upper part to prepare a thermoelectric power generation module. Note that here, the non-magnetic wire 23_a_ was arranged obliquely with respect to the magnetic wire 21_a_.

FIG. 6C shows the maximum power generation amount Pmax in the residual magnetization state without an external magnetic field with respect to a temperature difference dT given to the upper and lower Al—N substrates of the power generation module. The module1 and module2 represent the measurement results when the module was set and caused to rotate by 90° in the in-plane direction with respect to the measuring apparatus, and the 1st, 2nd, and 3rd indicate the results of repeated measurement under the same conditions. The output voltage of 25 mV and the power generation amount of 56 μW and the output voltage of 18 mV and the power generation amount of 30 μW were respectively observed when a temperature difference of 65 K was applied to the module and when a temperature difference of 47 K was applied to the module, which indicated that the present invention can be used as a thermoelectric power generation module.

INDUSTRIAL APPLICABILITY

As described above in detail, in accordance with the thermoelectric power generation device according to the present invention, it is possible to provide a thermopile structure that efficiently utilize thermal energy/heat flow passing through a power generation module/heat flow sensor.

In this regard, the thermoelectric power generation device according to the present invention can be used for, for example, a suit, a bag, and a clock that generate electricity using a difference between body temperature and outside temperature, a power generation device using a hot spring pipe, or a spontaneous power generation recycle system using waste heat from a personal computer.

REFERENCE SIGNS LIST

10 existing thermoelectric power generation device
11 substrate
12 generator
12*a* generator thin line
13 connector
13*a* connector thin line
18, 19 thermoelectric power generation device
20 substrate (base material)
21 plurality of magnetic wires
21*a* first magnetic wire
21*b* second magnetic wire arranged adjacent to the first magnetic wire 21*a*
22 insulation film
23 plurality of non-magnetic wires
23*a* non-magnetic wire
24 through contact hole
26 direction of anomalous Nernst electric field of magnetic material
27 plurality of diamagnetic wires
27*a* diamagnetic wire
28 direction of anomalous Nernst electric field of diamagnetic material

The invention claimed is:

1. A thermoelectric power generation device, comprising:

an insulation film comprising an insulating material and having a first outer surface and a second outer surface opposite from the first outer surface;

a plurality of magnetic wires that has a thin film fine line shape or a bar shape, is formed of a single magnetic material capable of exhibiting an anomalous Nernst effect, and is arranged in parallel on the first outer surface of the insulation film;

a plurality of non-magnetic wires that has a thin film fine line shape or a bar shape, is formed of a non-magnetic material, and is arranged in parallel on the second outer surface of the insulation film so as to be parallel or oblique to a direction in which the plurality of magnetic wires is extended;

through contact holes that pass through the insulation film and electrically connect the plurality of magnetic wires and the plurality of non-magnetic wires so that a first magnetic wire and a second magnetic wire adjacent to each other, of the plurality of magnetic wires, can be connected in series via one of the plurality of non-magnetic wires; and a substrate that is formed of an insulating material or a conductive material coated with an insulating material, holds a stacked body of the plurality of magnetic wires, the insulation film, and the plurality of non-magnetic wires, and is in thermal contact with the stacked body, wherein a width of each non-magnetic wire of the plurality of non-magnetic wires is narrower than a width of each magnetic wire of the plurality of magnetic wires, wherein both end portions in a wire-extending direction of the non-magnetic wire that connect the first and second magnetic wires adjacent to each other are respectively electrically connected to one end portion of the first magnetic wire in the wire-extending direction and another end portion of the second magnetic wire in the wire-extending direction via the through contact holes, which are filled with a conductive material, wherein an interval between the plurality of magnetic wires is narrower than at least one of a length or the width of the magnetic wire.

2. The thermoelectric power generation device according to claim 1, wherein the non-magnetic material is any one of Cu, Ag, Au, Al, Rh, W, Mo, Pt, Pd, and alloy materials containing these.

3. The thermoelectric power generation device according to claim 1, wherein the magnetic material of the plurality of magnetic wires is any one of Fe—Al, Fe—Ga, Fe—Sn, Fe—Pt, Mn—Ga, Mn—Ge, Mn—Sn, Ni—Pt, Co—Gd, $Fe_4N$, an $Mn_3AN$ (A=Mn, Pt, or Ni) or $Co_2YZ$ (Y=Ti, V, Cr, Mn, or Fe; Z=Ga, Ge, Al, Si, Sn, or Sb) Heusler alloy, an Sm—Co permanent magnet material, an Nd—Fe—B permanent magnet material, and GaMnAs.

4. The thermoelectric power generation device according to claim 1, wherein the insulating material forming the insulation film is any one of MgO, Si—O, Si—N, Al—O, Al—N, BN, and C.

5. The thermoelectric power generation device according to claim 1, wherein the substrate is formed of one of MgO, silicon with thermal oxide film, Si—O, Si—N, Al—O, Al—N, SiC, sapphire, glass, polyimide, polyethylene naphthalate, and diamond as the insulating material, or one of silicon, Cu, Ag, Au, Al, Rh, W, Mo, Pt, and Pd as the conductive material coated with an insulating material.

6. The thermoelectric power generation device according to claim 1, wherein when the thermoelectric power generation device is used as a heat flow sensor, each magnetic wire of the plurality of magnetic wires has a thin film fine line shape and has the width W of 10 nm to 1 mm, a thickness T of 1 nm to 100 μm, and a length L of 1 μm to 10 cm.

7. The thermoelectric power generation device according to claim 1, wherein when the thermoelectric power generation device is used as a thermoelectric power generation module, each magnetic wire of the plurality of magnetic wires has a bar shape and has the width W of 10 μm to 5 mm, a thickness T of 10 μm to 1 cm, and a length L of 1 mm to 100 cm.

8. The thermoelectric power generation device according to claim 1, wherein a film thickness of the insulation film is 1 nm to 1 cm.

9. The thermoelectric power generation device according to claim 1, wherein a thickness of the substrate is 3 μm to 3 mm.

10. A thermoelectric power generation device, comprising:

an insulation film comprising an insulating material and having a first outer surface and a second outer surface opposite from the first outer surface;

a plurality of magnetic wires that has a thin film fine line shape or a bar shape, is formed of a single magnetic material capable of exhibiting an anomalous Nernst effect, and is arranged in parallel on the first outer surface of the insulation film;

a plurality of diamagnetic wires that has a thin film fine line shape or a bar shape, is formed of a magnetic material, and is arranged in parallel on the second outer surface of the insulation film so as to be parallel or oblique to a direction in which the plurality of magnetic wires is extended;

through contact holes that pass through the insulation film and electrically connect the plurality of magnetic wires and the plurality of diamagnetic wires so that a first magnetic wire and a second magnetic wire adjacent to each other, of the plurality of magnetic wires, can be connected in series via one of the plurality of diamagnetic wires; and a substrate that is formed of an insulating material or a conductive material coated with an insulating material, holds a stacked body of the plurality of magnetic wires, the insulation film, and the plurality of diamagnetic wires, and is in thermal contact with the stacked body, wherein a width of each diamagnetic wire of the plurality of diamagnetic wires is narrower than a width of each magnetic wire of the plurality of magnetic wires, wherein both end portions in a wire-extending direction of the diamagnetic wire that connect the first and second magnetic wires adjacent to each other are respectively electrically connected to one end portion of the first magnetic wire in the wire-extending direction and another end portion of the second magnetic wire in the wire-extending direction via the through contact holes, which are filled with a conductive material, wherein an interval between the plurality of magnetic wires is narrower than at least one of a length or the width of the magnetic wire.

11. The thermoelectric power generation device according to claim 10, wherein the magnetic material forming the plurality of magnetic wires has positive thermoelectric power, and the magnetic material forming the plurality of diamagnetic wires has negative thermoelectric power.

12. The thermoelectric power generation device according to claim 10, wherein the magnetic material forming the plurality of magnetic wires has negative thermoelectric power, and the magnetic material forming the plurality of diamagnetic wires has positive thermoelectric power.

* * * * *